United States Patent [19]

Traskos et al.

[11] Patent Number: 4,915,981

[45] Date of Patent: Apr. 10, 1990

[54] METHOD OF LASER DRILLING FLUOROPOLYMER MATERIALS

[75] Inventors: Richard T. Traskos, Brooklyn; Cathy A. Fleischer, Canterbury; Carlos L. Barton, Brooklyn; David B. Noddin, Ledyard, all of Conn.

[73] Assignee: Rogers Corporation, Rogers, Conn.

[21] Appl. No.: 231,693

[22] Filed: Aug. 12, 1988

[51] Int. Cl.$^4$ .............................................. B05D 3/06
[52] U.S. Cl. ................... 427/53.1; 156/643; 156/902; 219/121.7; 219/121.71
[58] Field of Search ................. 427/53.1, 97; 156/643, 156/902; 219/121.7, 121.71

[56] References Cited

U.S. PATENT DOCUMENTS

| | | | |
|---|---|---|---|
| 4,473,737 | 9/1984 | Anthony | 219/121.71 |
| 4,508,749 | 4/1985 | Brannon et al. | |
| 4,598,039 | 7/1986 | Fischer et al. | 219/121.17 |
| 4,642,160 | 2/1987 | Burgess | |

OTHER PUBLICATIONS

H. R. Philip et al.; Optical Absorption of Some Polymers in the Region 240-170 NM; Appln. Phys. Lett., 48(2), Jan. 13, 1986.

S. G. Hansen et al.; Formation of Polymer Films by Pulsed Laser Evaporation; Appl. Phys. Lett., 52(1), Jan. 4, 1988.

Primary Examiner—Stanley Silverman
Attorney, Agent, or Firm—Fishman, Dionne & Cantor

[57] ABSTRACT

A method of ablating fluoropolymer composite materials is presented wherein it has been found that small holes (less than 100 μm) can be formed in fluoropolymer composite laminate materials using UV lasers. The resulting holes can be used to produce vias and plated through-holes having smooth side walls with little or no debris or residue remaining in the holes and minimal damage to the polymer. Thus, the vias and plated through-holes can be plated without further cleaning processes. In addition, the holes are formed at a relatively fast rate.

16 Claims, 4 Drawing Sheets

36

METHOD OF LASER DRILLING FLUOROPOLYMER MATERIALS

BACKGROUND OF THE INVENTION:

This invention relates generally to laser ablation of fluoropolymer composite materials. More particularly, this invention relates to the laser ablation of fluoropolymer composites using ultraviolet radiation to form holes in circuit substrates for producing plated through-holes and plated vias.

As is well known, during circuit manufacturing, holes are needed to be formed through the circuit substrate and conductive layers. These holes are used to form vias which interconnect different conductive layers in a multi layer circuit laminate; and to produce plated through holes needed to interconnect spaced, opposed circuit layers in a diclad laminate.

Often, there is a need to form such holes with very small diameters (typically 25–200 μm) through the generally copper clad laminates. In addition, to keep manufacturing costs low, these small diameter holes need to be formed at a reasonably fast rate (e.g. about one hole per second). Unfortunately, such holes are difficult or impossible to produce by mechanical drilling techniques.

Presently, infrared laser radiation (using a $CO_2$ laser) is used to drill vias in fluoropolymer substrates. At the infrared wavelength of the $CO_2$ laser (10.6 μm), the fluoropolymer is absorptive and can be readily ablated. However, due to the long wavelength, the ablation is purely thermal. The hole walls are often roughened and damaged, which limits the possible resolution. In addition, at the $CO_2$ laser wavelength, a thin carbonaceous residue is left on the copper or the hole walls and often on the surface surrounding the hole which then requires further cleaning by expensive processes such as plasma cleaning and the like. It will be appreciated that plasma cleaning can be expensive and problematic.

Ablation by ultraviolet radiation (as opposed to infrared radiation) has been proposed for etching polyimide circuit materials (see U.S. Pat. No. 4,508,749 to Brannon et al). However, UV radiation to form holes in fluoropolymeric circuit laminate materials has generally been thought unfeasible because fluoropolymers do not absorb UV (200–400 nm) radiation. For example, in an article entitled "Optical Absorption of Some Polymers in the Regions 240-170 nm" by Philipp et al (Appl. Phys, Lett. 48(2), 12 Jan. 1986), the authors provide evidence that absorption coefficients at 193 nm for polytetrafluoroethylene is about $2 \times 10^2$ cm$^{-1}$ as opposed to, for example, polyimide which is $4 \times 10^5$ cm$^{-1}$. Similar results using a laser at wavelengths of 193 nm and 248 nm were reported in an article entitled "Formation of Polymer Films by Pulsed Laser Evaporation" by Hansen et al, (Appl. Phys. Lett 52(1), 4 Jan. 1988). Thus, while it is quite apparent that polyimide materials such as those disclosed in U.S. Pat. No. 4,508,749 could be ablated by ultraviolet radiation, it is generally held that UV radiation cannot be practically used for ablation of fluoropolymer materials.

SUMMARY OF THE INVENTION

The above-discussed and other problems and deficiencies of the prior art are overcome or alleviated by the method of ablating fluoropolymer composite materials of the present inventions. In accordance with the present invention, the inventors have discovered that small holes (less than 100 μm) can be formed in fluoropolymer composite laminate materials using UV lasers. The resulting holes can be used to produce vias and plated through-holes having smooth side walls with little or no debris or residue remaining in the holes and minimal damage to the polymer. Thus, the vias and plated through-holes can be plated without further cleaning processes. In addition, the holes are formed at a relatively fast rate.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

This invention relates to a method for ultraviolet laser ablation of fluoropolymer composite materials. It has been found that UV laser radiation of wavelengths between 190 nm and 400 nm can be used to drill small, clean holes in fluoropolymer composites with up to 60% or more filler by volume. This is an unexpected and surprising discovery since it is well known that fluoropolymers are transparent to UV radiation. As fluoropolymer resins are quite transparent at these wavelengths, it is theorized that the addition of filler particles to the fluoropolymer increases the absorptivity and thus the etching efficiency. In addition to the filler absorptivity other factors which may increase fluoropolymer composite absorptivity include the particle shape and surface roughness, particle reflectivity, and volume percent of the filler or fillers. One or more of these factors may come into play in absorbing the incident energy and effecting clean ablation of both the filler and the fluoropolymer. Of course, the foregoing has been theorized only and applicants are not bound to the described mechanism of this invention.

Figure 1:
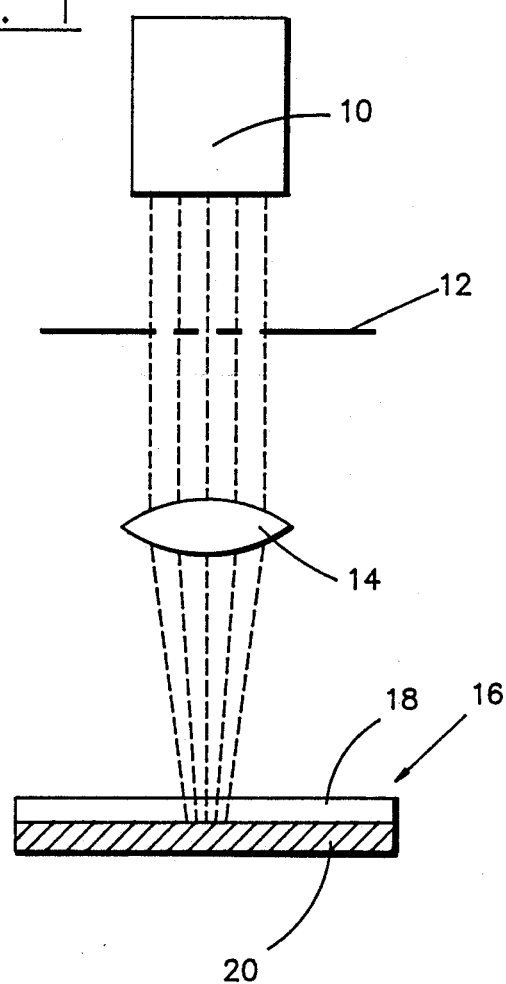
FIG. 1 is a schematic side elevation view of a UV laser for producing vias in a fluoropolymer composite material.

Turning to FIG. 1, it will be appreciated that vias can be drilled in fluoropolymer composite substrates using focused UV laser radiation directly, or preferably, by directing the laser light through a mask prior to focusing. In FIG. 1, a UV laser is shown at 10 directing UV radiation through mask or pattern 12, focusing lens 14 and onto fluoropolymer laminate 16 which consists of a layer of filled fluoropolymer substrate material 18 clad on one side with a metal layer 20 (e.g. copper). Alternatively, the mask 12 may be placed directly on the fluoropolymer laminate 16 in a known fashion.

The flouropolymer substrate material 18 is filled with suitable fiber or particulate filler. Examples of suitable fluoropolymers include polytetrafluoroethylene (PTFE), a copolymer of TFE and perfluorovinyl ether (PFA), a copolymer of TFE and hexafluoropropylene (FEP), a polychlorotrifluoroethylene (PCTFE) and composites including these resins. Fillers could include microglass, silica, titanium dioxide, carbon fibers, microballoons, Kevlar and other ceramic or polymeric fillers. Also, the filler content could be in excess of 60% and the filler particles could be of different sizes (submicron to 100 $\mu$m), and shapes (fibers, spheres or irregular particles). In addition to copper, the cladding used could be other metals such as gold, silver, chromium and nickel. The method of the present invention is particularly well suited for use with microwave laminates sold by Rogers Corporation (assignee of the present application) under the trademark RT/DUROID and DUROID. Still other particularly advantageous materials are the fluoropolymeric laminates sold by Rogers Corporation under the trademarks RO2500 and RO2800 and described in U.S. Pat. Nos. 4,647,508 and 4,634,631 and U.S patent application Ser. No. 4,647,508 filed Feb. 17, 1987 (now U.S. Pat. No. 4,849,284), all of which are assigned to the assignee hereof.

Figure 2:
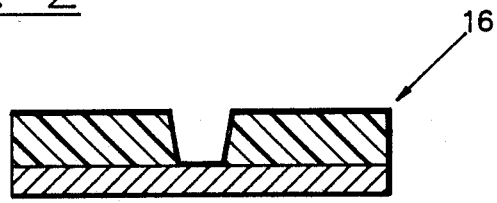
FIG. 2 is a cross sectional elevation view of an electroless plated via formed using the apparatus of FIG. 1.

It is believed that the filler improves the efficiency of ablation as the absorption coefficient of PTFE is so low as to be considered negligible (less than 100 cm$^{-1}$). Thus, the filler may be increasing the absorptivity to improve the etching efficiency. As shown in FIGS. 2- and 3, holes formed through the fluoropolymer materials can be made to produce blind vias using a UV excimer laser at 193 nm (ArF), 248 nm (KrF), 308 nm (XeCl) and 351 nm (XeF) and energy densities in the range of 1.0–6.0 J/cm$^2$.

Figure 3:
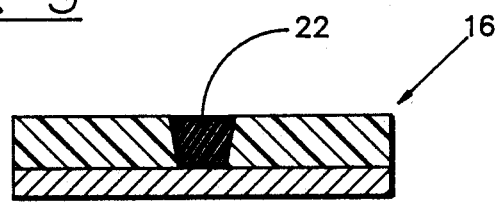
FIG. 3 is a cross sectional elevation view of an electroplated via formed using the apparatus of FIG. 1.

Fluoropolymer ablation rates of 2.5-5.0 um/pulse will result in this energy range, which corresponds to 0.37–0.75 mm/sec at 150 Hz. An example of a blind via drilled in RO2800 at 4 J/cm$^2$ is shown in FIGS. 2 and 3. Following drilling, the holes can be metallized using any known method including electroless plating and vapor deposition techniques such as sputtering or evaporation (FIG. 2) to form blind via 24; or holes can be electroplated to form electroplated blind via 26 (FIG. 3) without further laser cleaning.

It will be appreciated from a review of FIG. 1-3 that the focused UV radiation will drill a hole from the upper surface of substrate 18 downwardly and progressively toward the lower surface thereof which is in contact with metal layer 20.

With regard to the production of vias, the ultraviolet laser drilling process of the present invention exhibits many advantages over more conventional infrared laser (CO$_2$ and Nd-YAG lasers) processes. First of all, when drilling blind vias with UV light, the bottom copper surface is clean and can be plated without further cleaning (such as expensive plasma cleaning). Vias produced using a CO$_2$ laser require post-laser cleaning before plating, due to residue left on the copper surface. Also, as a result of the short wavelength of UV light relative to IR light, resolution is improved and ablation may be photochemical as well as thermal, resulting in vias which are cleaner and well defined. Therefore, smaller vias could be produced with UV light as compared to IR light. In addition, laser ablation of fluoropolymer composites is fast, with typical removal rates of 5 um/pulse, which corresponds to 0.75 mm/second at a rep rate of 150 Hz.

Figure 4:
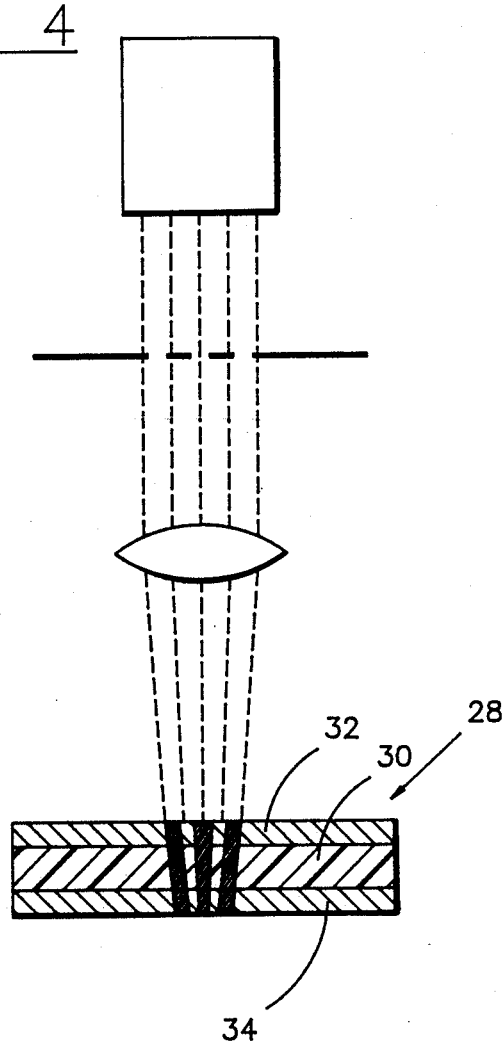
FIG. 4 is a schematic side elevation view of a UV laser for producing plated through-holes in a fluoropolymer composite diclad material.
Figure 5:
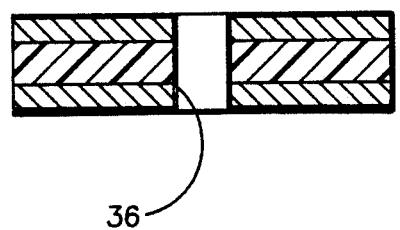
FIG. 5 is a cross sectional elevation view of an electroless plated through-hole formed using the apparatus of FIG. 4.

Turning now to FIG. 4, a UV laser assembly substantially similar to that shown in FIG. 1 is depicted for use with a diclad laminate 28 for the formation of plated through-holes. Diclad laminate 28 includes a fluoropolymer composite substrate 30 of the type described in detail above clad on opposed sides with a metal layer (generally copper) 32 and 34. Through holes (FIG. 5) may be produced using a UV excimer laser at 193 nm (ArF), 248 nm (KrF), 308 nm (XeCl) and 351 nm (XeF) and energy densities in the range of 4.0–8.0 j/cm$^2$. At these conditions, the fluoropolymer ablates at a rate of 2.5–5.0 um/pulse, which corresponds to a rate of 0.37–0.75 mm/sec at 150 Hz. The copper ablates at a rate of 0.070–0.10 um/pulse, which corresponds to an etch rate of 10–15 um/sec at 150 Hz. An example of a through-hole made by this method is shown in FIG. 5. Minimal polymer damage has been found due to the low absorptivity of the polymer, and the high absorptivity of the copper. Following via drilling the through-hole would be electrolessly plated (or vapor deposited) and then electroplated to form plated through hole 36.

As discussed above, the ultraviolet laser drilling process of the present invention exhibits many advantages over more conventional infrared laser (CO$_2$ and Nd-YAG lasers) processes. Due to the low reflectivity of certain metal (i.e. copper) at UV wavelengths, vias can be drilled through diclad substrates at low energy densities relative to that of IR laser wavelengths. In addition, due to the low absorptivity of fluoropolymers, the ablation threshold is high relative to most polymers. Therefore, holes can be drilled in copper/fluoropolymer composite laminates with little damage observed in the fluoropolymer near the hole wall. Finally, as a result of the short wavelength of UV light relative to IR light, resolution is improved, and ablation may be photochemical as well as thermal, resulting in vias which are clean and well defined. Such clean and well defined through holes are generally not obtained using IR lasers which, because of the required higher energies, lead to desalination at the metal/dielectric interface in the area of the through hole (e.g. etch-back of the dielectric at the hole). The present invention also permits the formation of relatively small through holes (e.g. less than 50–100 $\mu$m); although it will of course be appreciated that larger through holes and blind vias (e.g. greater than 100 $\mu$m) can also be made by this process.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of forming a hole through a substrate comprised of a composite, the composite including fluoropolymeric matrix material which is substantially transparent to ultraviolet radiation and at least one filler material disposed within said fluoropolymeric matrix material, the filler material interacting with said fluoropolymeric matrix material so as to render said composite absorptive to ultraviolet radiation wherein said composite defines a filled fluoropolymeric composite, the substrate further having opposed first and second surfaces, comprising the step of:

delivering ultraviolet radiation onto said first surface of said filled fluoropolymer composite substrate for sufficient time to ablate said composite and form a hole wherein said substrate is progressively ablated from said first surface to said opposed second surface.

2. The method of claim 1 including the steps of:
locating a mask between the source of UV radiation and said filled fluoropolymer composite, said mask having a preselected pattern; and
directing said UV radiation through said pattern in said mask wherein said UV radiation is imaged on said composite to form one or more holes.

3. The method of claim 2 including the step of:
locating an optical system between said mask and said composite; and
directing said UV radiation through said optical system.

4. The method of claim 1 including:
at least a first metal layer on one of said opposed surfaces of said substrate.

5. The method of claim 4 including:
a second metal layer on the other of said opposed surfaces of said substrate.

6. The method of claim 4 including:
electroplating said hole to define an electroplated blind via.

7. The method of claim 4 including:
metallizing said hole to define a blind via.

8. The method of claim 7 wherein said metallizing step includes:
electroless plating or vapor depositing metal into said hole.

9. The method of claim 5 wherein said hole defines a through-hole and including:
metallizing said through-hole.

10. The method of claim 9 wherein said metallizing step includes:
electroless plating or vapor depositing metal into said through hole.

11. The method of claim 4 wherein:
said UV radiation is delivered by a UV excimer laser having an energy density in the range of 1.0 to 6.0 $J/cm^2$.

12. The method of claim 5 wherein:
said UV radiation is delivered by a UV excimer laser having an energy density in the range of 4.0 to 8.0 $J/cm^2$.

13. The method of claim 1 wherein:
said fluoropolymeric composite includes at least one of the fluoropolymers selected from the group consisting of polytetrafluoroethylene (PTFE), a copolymer of TFE and perlluorovinyl ether (PFA), a copolymer of TFE and hexafluoropropylene (FEP) and a polychlorotrifluoroethylene (PCTFE).

14. The method of claim 1 wherein:
said filled fluoropolymeric composite includes at least one of the fillers selected from the group consisting of microglass, silica, titanium dioxide, carbon fibers, microballoons and Kevlar.

15. The method of claim 1 wherein:
said filled fluoropolymeric composite includes at least one of the fillers selected from the group consisting of ceramic and polymeric fillers.

16. The method of claim 1 wherein:
said ultraviolet radiation has a wavelength between about 190 nm to 400 nm.

* * * * *